US008866007B2

(12) United States Patent
Atwater

(10) Patent No.: US 8,866,007 B2
(45) Date of Patent: Oct. 21, 2014

(54) PLASMONIC PHOTOVOLTAICS

(75) Inventor: Harry A. Atwater, South Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 674 days.

(21) Appl. No.: 11/759,752

(22) Filed: Jun. 7, 2007

(65) Prior Publication Data

US 2007/0289623 A1 Dec. 20, 2007

Related U.S. Application Data

(60) Provisional application No. 60/811,668, filed on Jun. 7, 2006.

(51) Int. Cl.

| | |
|---|---|
| ***H01L 31/00*** | (2006.01) |
| ***H01L 31/0392*** | (2006.01) |
| ***H01L 31/078*** | (2012.01) |
| ***H01L 31/0352*** | (2006.01) |
| ***H01L 31/0216*** | (2014.01) |
| *B82Y 20/00* | (2011.01) |

(52) U.S. Cl.

CPC ........... *H01L 31/02168* (2013.01); *B82Y 20/00* (2013.01); *H01L 31/0392* (2013.01); *H01L 31/078* (2013.01); *Y02E 10/50* (2013.01); *H01L 31/035236* (2013.01)

USPC ........................................................ 136/257

(58) Field of Classification Search

CPC . H01L 31/055; H01L 31/0232; H01L 31/076; H01L 31/07225; H01L 31/078; H01L 31/035236; H01L 31/02168; H01L 31/0392; G02B 6/42; G02B 6/1226; G02B 6/4295; B82Y 20/00

USPC ................ 136/243, 258, 260, 263, 264, 257; 257/292, 293

See application file for complete search history.

(56) References Cited

U.S. PATENT DOCUMENTS

| | | | | |
|---|---|---|---|---|
| 4,133,698 A * | 1/1979 | Chiang et al. | ................. | 136/255 |
| 4,482,779 A * | 11/1984 | Anderson | ..................... | 136/255 |
| 4,737,197 A * | 4/1988 | Nagahara et al. | ............. | 136/256 |
| 4,915,482 A * | 4/1990 | Collins et al. | ................. | 359/276 |
| 5,279,679 A * | 1/1994 | Murakami et al. | ............ | 136/246 |
| 5,583,351 A * | 12/1996 | Brown et al. | ................... | 257/89 |
| 6,285,020 B1 | 9/2001 | Kim et al. | | |
| 6,300,558 B1 * | 10/2001 | Takamoto et al. | ............ | 136/262 |

(Continued)

FOREIGN PATENT DOCUMENTS

| | | | | |
|---|---|---|---|---|
| JP | 2004-103521 | * 2/2004 | ............ | H01M 14/00 |
| WO | WO2004/108589 A2 | * 12/2004 | | |

OTHER PUBLICATIONS

JP2004-103521, Machine Translation, Feb. 2004.*

(Continued)

*Primary Examiner* — Devina Pillay

(74) *Attorney, Agent, or Firm* — Christie, Parker & Hale, LLP

(57) ABSTRACT

A surface plasmon polariton photovoltaic absorber. A plasmonic photovoltaic device is provided that has a periodic subwavelength aperture array, for example a thin metal film coated with an array of semiconductor quantum dots. The plasmonic photovoltaic device generates an electrical potential when illuminated by electromagnetic radiation. In some embodiments, the absorber can contain both quantum dots of semiconductors and metal nanoparticles.

12 Claims, 5 Drawing Sheets

(56) References Cited

U.S. PATENT DOCUMENTS

| | | | | |
|---|---|---|---|---|
| 6,384,318 | B1 * | 5/2002 | Nomura | 136/256 |
| 6,441,298 | B1 | 8/2002 | Thio | |
| 2004/0118448 | A1 * | 6/2004 | Scher et al. | 136/252 |
| 2004/0200523 | A1 * | 10/2004 | King et al. | 136/262 |
| 2006/0001055 | A1 * | 1/2006 | Ueno et al. | 257/257 |
| 2006/0112983 | A1 * | 6/2006 | Parce et al. | 136/250 |
| 2008/0236657 | A1 * | 10/2008 | Brabec et al. | 136/252 |

OTHER PUBLICATIONS

Oberbeck et al. High rate Deposition of Epitaxial Layers for Efficient Low Temperature Thin Film Epitaxial Silicon Solar Cells, Prog. in Photovoltaic Research and Applications 2001, 9, 333-340.*

Schaadt et al. "Enhanced semiconductor optical absorption via surface plasmon excitation in metal nanoparticles", Applied Physics Letter, pp. 063106-1-063106-3, vol. 86, Feb. 2005.*

Schaadt "Enhanced semiconductor optical absorption via surface plasmon excitation in metal nanoparticles", Applied Physics Letters 86, pp. 063106-1-063106-3, Feb. 2005.*

Pillai, "Enhanced emission from Si-based light-emitting diodes using surface plasmons", Applied Physics Letters 88, pp. 161102-1-11602-3, Apr. 2006.*

Catchpole, "Novel Applications for Surface Plasmons in Photovoltaics", 3rd World Conference on Photovoltaic Energy Conversion, pp. 2714-2717, May 11-18, 2003.*

Atwater et al., "The Promise of Plasmonics", Scientific America, vol. 296, issue 4, Apr. 2007.

Walters et al., "Field-effect electrluminescence in silicon nanocrystals", Nature Materials, vol. 4 , pp. 143-146, Feb. 2005.

Maier et al., "Local detection of electromagnetic energy transport below the diffraction limit in metal nanoparticle . . . ", Nature Materials, vol. 2, pp. 229-232, Apr. 2003.

Atwater, et al.; The new "*p-n* Junction": Plasmonics enables photonic access to the nanoworld; MRS Bulletin, vol. 30, pp. 385-389 (May 2005).

Maier, et al.; Optical pulse propogation in metal nanoparticle chain waveguides; Physical Review B 67, 205402 (2003).

Dionne, et al.; Plasmon slot waveguides: Towards chip-scale propagation with subwavelength-scale localization; Physical Review B 73, 35407 (2006).

Penninkhof, et al.; Mega-electron-volt ion beam induced anisotropic plasmon resonance of silver nanocrystals in glass; Applied Physics Letters, vol. 83, No. 20, pp. 4137-4139 (Nov. 17, 2003).

Biteen, et al.; Enhanced radiative emission rate and quantum efficiency in coupled silicon nanocrystal-nanostructured gold emitters; Nano Letters, vol. 5, No. 9, pp. 1768-1773 (2005).

Kayes; et al.; Comparison of the device physics principles of planar and radial *p-n* junction nanorod solar cells; Journal of Applied Physics 97, 114302 (2005).

Richardson, et al.; A phase diagram of low temperature epitaxial silicon grown by hot-wire chemical vapor deposition for photovoltaic devices; presented at Spring Meeting of Materials Research Society (2005).

Sweatlock, et al.; Highly confined electromagnetic fields in arrays of strongly coupled Ag nanoparticles; Physical Review B 71, 235408 (2005).

Maier, et al.; Plasmonics: Localization and guiding of electromagnetic energy in metal/dielectric structures; Journal of Applied Physics 98, 011101 (2005).

Mertens, et al.; Polarization-selective plasmon-enhanced silicon quantum-dot luminescence; Nano Letters, vol. 6, No. 11, pp. 2622-2625 (2006).

Kayes, et al.; Synthesis and characterization of silicon nanorod arrays for solar cell applications; IEEE 4th World Conference on Photovoltaic Energy Conversion Proceedings (2006).

Biteen; et al.; Spectral tuning of plasmon-enhanced silicon quantum dot luminescence; Applied Physics Letters 88, 131109 (2006).

* cited by examiner

PLASMONIC PHOTOVOLTAICS

CROSS-REFERENCE TO RELATED APPLICATIONS

This application claims priority to and the benefit of U.S. provisional patent application Ser. No. 60/811,668, filed Jun. 7, 2006, which application is incorporated herein by reference in its entirety.

STATEMENT REGARDING FEDERALLY FUNDED RESEARCH OR DEVELOPMENT

The U.S. Government has certain rights in this invention pursuant to Grant No. FA9550-04-I-0434 awarded by the Air Force Office of Scientific Research (AFOSR).

FIELD OF THE INVENTION

The invention relates to photovoltaic devices in general and particularly to photovoltaic devices that employ plasmons.

BACKGROUND OF THE INVENTION

Since 2001, there has been an explosive growth of scientific interest in the role of surface plasmons in optical phenomena including guided-wave propagation and imaging at the subwavelength scale, nonlinear spectroscopy and 'negative index' metamaterials. The unusual dispersion properties of metals enable excitation of propagating surface plasmon modes away from the plasmon resonance and near the plasmon resonance enables excitation of localized resonant modes in nanostructures that access a very large range of wavevectors over the visible and near infrared frequency range. Both resonant and nonresonant plasmon excitation allows for light localization in ultrasmall volumes in metallodielectric structures.

To date, little systematic, comprehensive thought has been given to the question of how plasmon excitation and light localization might be exploited to advantage in photovoltaics. Conventionally, photovoltaic absorbers must be optically 'thick' to enable nearly complete light absorption and photocarrier current collection. They are usually semiconductors whose thickness is typically several times the optical absorption length. For silicon, this thickness is greater than 50 microns, and it is several microns for direct bandgap compound semiconductors. High efficiency cells must have minority carrier diffusion lengths several times the material thickness. Thus conventional solar cell design and material synthesis considerations are strongly dictated by this simple optical thickness requirement.

Thus there is a need for systems and methods that both enhance photovoltaic performance and reduce cost by using reduced amounts of inexpensive material.

SUMMARY OF THE INVENTION

In one aspect, the invention relates to a surface plasmon polariton photovoltaic absorber. The surface plasmon polariton photovoltaic absorber comprises a substrate; at least one absorber layer disposed on the substrate, the absorber layer having a surface; a layer of conductive material comprising a surface plasmon polariton guiding layer disposed on the surface of the at least one absorber layer; and at least two electrodes, a first of which electrodes is in electrical communication with a first charge collection region of the photovoltaic absorber in which electrical charges of a first polarity are concentrated, and a second of which electrodes is in electrical communication with a second charge collection region of the photovoltaic absorber in which electrical charges of a second polarity are concentrated; the surface plasmon polariton photovoltaic absorber configured to generate an electrical potential between the first and the second electrodes when the surface plasmon polariton photovoltaic absorber is illuminated with electromagnetic radiation.

In one embodiment, the at least one absorber layer is a polycrystalline semiconductor thin film. In one embodiment, the at least one absorber layer is an epitaxial semiconductor thin film. In one embodiment, the at least one absorber layer is a thin film of absorbing molecules. In one embodiment, the at least one absorber layer comprises a semiconductor. In one embodiment, the semiconductor is selected from the group consisting of silicon, GaAs, CdTe, CuInGaSe (CIGS) CdSe, PbS, and PbSe. In one embodiment, the semiconductor comprises an element from one or more of Groups II, III, IV, V, and VI of the periodic table.

In one embodiment, the surface plasmon polariton photovoltaic absorber further comprises metallic nanoparticles. In one embodiment, the metallic nanoparticles comprise a selected one of silver, gold, copper and aluminum. In one embodiment, the conductive layer is a metallic structure. In one embodiment, the metallic structure is a thin film comprising a metal selected from one of silver, gold, copper and aluminum.

In one embodiment, the first photovoltaic absorber layer is configured to provide a first refractive index $n_1$ at the first surface and the second photovoltaic absorber layer is configured to provide a second refractive index $n_2$ at the second surface. In one embodiment, the first refractive index $n_1$ and the second refractive index $n_2$ are equal. In one embodiment, at least one of a first photovoltaic absorber layer and a second photovoltaic absorber layer is configured as a periodic subwavelength array of apertures, grooves or asperities. In one embodiment, the photovoltaic absorber layer comprises a dense array of quantum dots, In one embodiment, the photovoltaic absorber layer comprises a dense array of quantum wires or nanorods. In one embodiment, the photovoltaic absorber layer comprises a thin layer of absorbing organic or inorganic molecules. In one embodiment, the surface plasmon polariton photovoltaic absorber further comprises a continuous metallic thin film decorated with apertures, grooves or asperities.

In another aspect, the invention features a surface plasmon polariton photovoltaic absorber. The surface plasmon polariton photovoltaic absorber comprises a layer of conductive material having a first surface disposed on a first side thereof and a second surface disposed on a second side thereof, a first layer of a photovoltaic absorber disposed on the first surface of the conductive material; a second layer of a photovoltaic absorber disposed on the second surface of the conductive material; and at least two electrodes, a first of which electrodes is in electrical communication with a first charge collection region of the photovoltaic absorber in which electrical charges of a first polarity are concentrated, and a second of which electrodes is in electrical communication with a second charge collection region of the photovoltaic absorber in which electrical charges of a second polarity are concentrated. The surface plasmon polariton photovoltaic absorber is configured to generate an electrical potential between the first and the second electrodes when the surface plasmon polariton photovoltaic absorber is illuminated with electromagnetic radiation.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

FIG. 2(*b*) is a diagram showing an embodiment of a plasmonic photovoltaic structure comprising a quantum dot active layer, according to principles of the invention.

FIG. 2(*c*) is a diagram showing an embodiment of a plasmonic photovoltaic structure comprising a metallic nanoparticle plasmon resonant scattering layer, according to principles of the invention.

DETAILED DESCRIPTION OF THE INVENTION

Figure 1:
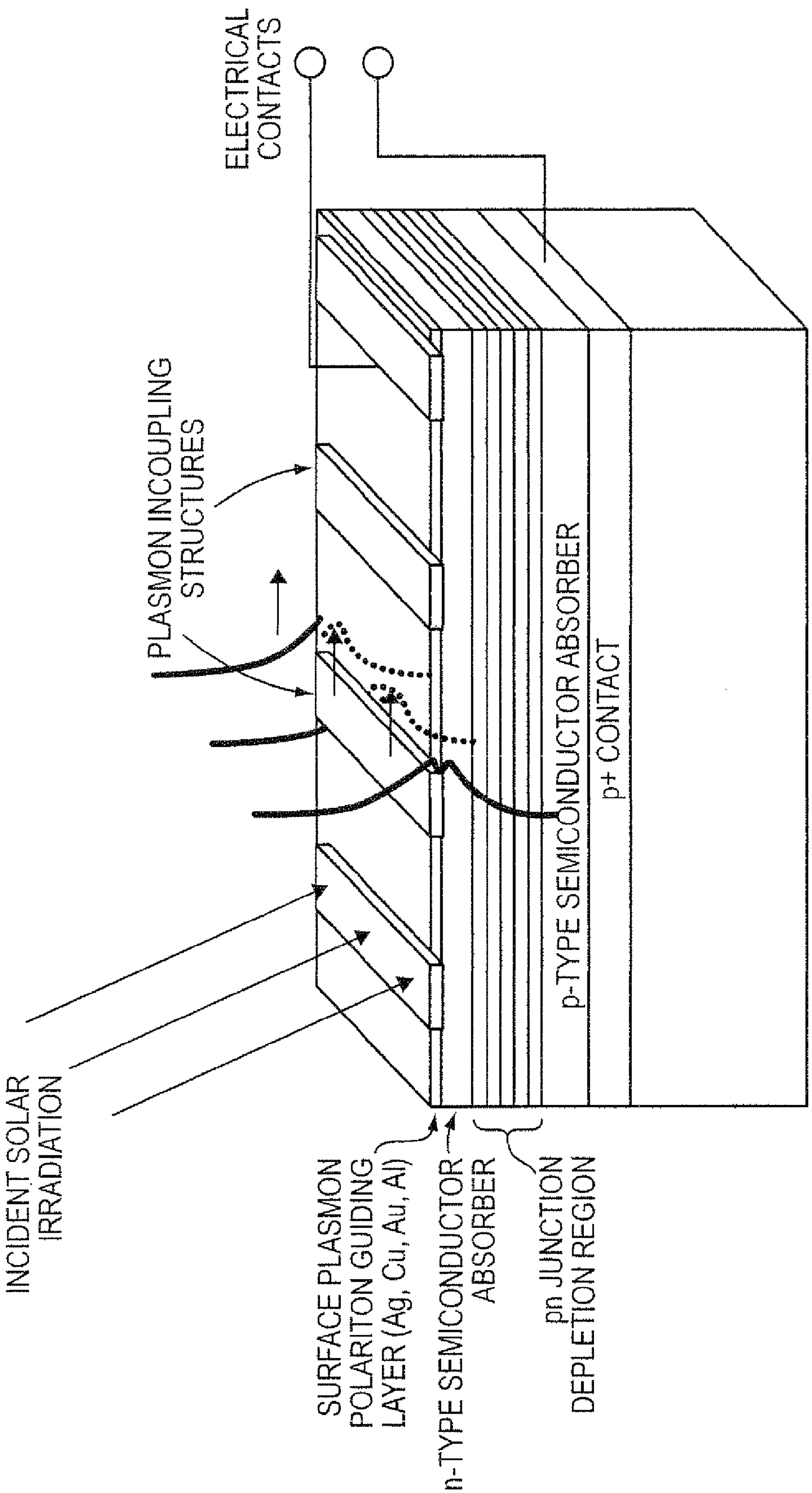
FIG. 1 is a diagram that illustrates an exemplary embodiment of a plasmonic photovoltaic structure coated with a semiconductor absorber, according to principles of the invention.

Dramatically reducing the absorber layer thickness could significantly expand the range and quality of absorber materials that are suitable for photovoltaic devices by, e.g., enabling efficient photocarrier collection across short distances in low dimensional structures such as quantum dots or quantum wells, and also in polycrystalline thin semiconductor films with very low minority carrier diffusion lengths. Beyond enhancing carrier collection in low cost, low quality absorber layers, plasmonic enhanced light absorption may increase solar cell efficiency for cells high quality photovoltaic absorber layers, because enhanced absorption allows one to reduce the solar cell base semiconductor volume, and in turn the dark recombination current, leading to an increase open circuit voltage.

We describe systems and methods derived from the rapid developing plasmonics field to dramatically modify the light absorption and transmission characteristics of photovoltaic materials and devices. A general discussion of plasmonic devices is included hereinbelow for the information of the reader. In particular, the ability of plasmonic structures to localize light at subwavelength dimensions is synergistic with use of ultrathin quantum dot and quantum well absorber materials, as well as inexpensive polycrystalline thin films.

Conventionally, photovoltaic absorbers must be optically 'thick' to enable nearly complete light absorption and photocarrier current collection. They are usually semiconductors whose thickness is typically several times the optical absorption length. For silicon, this thickness is greater than 100 microns, and it is several microns for direct bandgap compound semiconductors. Solar cell design and material synthesis considerations are strongly dictated by this simple requirement for optical thickness. A dramatic reduction in the required absorber layer thickness without loss of photon collection efficiency and generation of electron-hole pairs could significantly expand the range and quality of absorber materials that are suitable for photovoltaic devices by, e.g., enabling efficient photocarrier collection in low dimensional structures such as quantum dots and also in polycrystalline thin semiconductor films with very poor minority carrier diffusion lengths.

The consequences of plasmonic structure design for photovoltaics are potentially complex and far-reaching. Here, we focus on modifying optical absorption in photovoltaic materials, including the application of plasmonic systems and methods to modify light absorption in photovoltaic structures comprising ultrathin planar surface plasmon polariton photovoltaic absorbers, and to provide spectral tuning of enhanced absorption and emission in coupled quantum dot/metal nanoparticle absorbers. As is conventionally done in a photovoltaic absorber in order to extract electrical current across a potential difference (e.g., to obtain power) there are provided at least two electrodes, a first of which electrodes is in electrical communication with a first charge collection region of the photovoltaic absorber in which electrical charges of a first polarity are concentrated, and a second of which electrodes is in electrical communication with a second charge collection region of the photovoltaic absorber in which electrical charges of a second polarity are concentrated. The surface plasmon polariton photovoltaic absorber is configured to generate an electrical potential between the first and the second electrodes when the surface plasmon polariton photovoltaic absorber is illuminated with electromagnetic radiation. A load placed across the surface plasmon polariton photovoltaic absorber experiences a flow of current proportional to the generated electrical potential and inversely proportional to the impedance of the load when the surface plasmon polariton photovoltaic absorber is illuminated with electromagnetic radiation.

Alternative Embodiments Of The Invention

We now describe several alternative embodiments of surface plasmon polariton photovoltaic absorbers that are expected to operate according to the principals of the invention as described herein.

FIG. 1 is a perspective cross-sectional diagram that illustrates an exemplary embodiment of a plasmonic photovoltaic structure coated with a semiconductor absorber. In the description of FIG. 1 and the other figures, the structure will be described from the bottom layer of the figure to the top layer in succession. In FIG. 1, a substrate (the lowest layer of the figure) is provided upon which a p+ layer, for example comprising a semiconductor heavily doped with a suitable dopant that behaves as an electron deficient substance (such as boron or another Column III element in silicon) is provided as an electrical contact layer. Adjacent the p+ contact layer is a p-type semiconductor absorber, such as more lightly boron-doped silicon. Adjacent the p-type semiconductor absorber are one or more layers that comprise a p-i-n (p-type—intrinsic—n-type) junction region where generated charge carriers (electrons and holes) are separated. In some embodiments, the i or intrinsic layer is optional. Adjacent the p-i-n-junction region is a layer of n-type semiconductor absorber, for example phosphorus-doped silicon, or silicon doped with another column V element. Adjacent the n-type semiconductor absorber is a surface plasmon polariton guiding layer, which can comprise a metal such as silver (Ag), copper (Cu), gold (Au), or aluminum (Al). The surface plasmon polariton guiding layer comprises plasmon incoupling structures, which are periodic structures in communication with the guiding layer. The operation of a surface plasmon polariton guiding layer and the incoupling structures is described elsewhere herein. Electrical contacts, shown in FIG. 1 and in the other figures as lines from specified regions of the structure that terminate in circles (e.g., external terminals for making electrical connection to the plasmonic photovoltaic structure) are provided to allow the connection of the device to an external circuit so as to obtain power when the device is subjected to incident solar irradiation, or alternatively is subjected to light or electromagnetic radiation generally. In FIG. 1, the surface plasmon waves are shown by the curved lines that are indicated to flow in the direction of the horizontal arrows. The dotted portions of the curves are intended to illustrate the penetration of the surface Plasmon waves into the underlying semiconductor material.

Figure 2A:
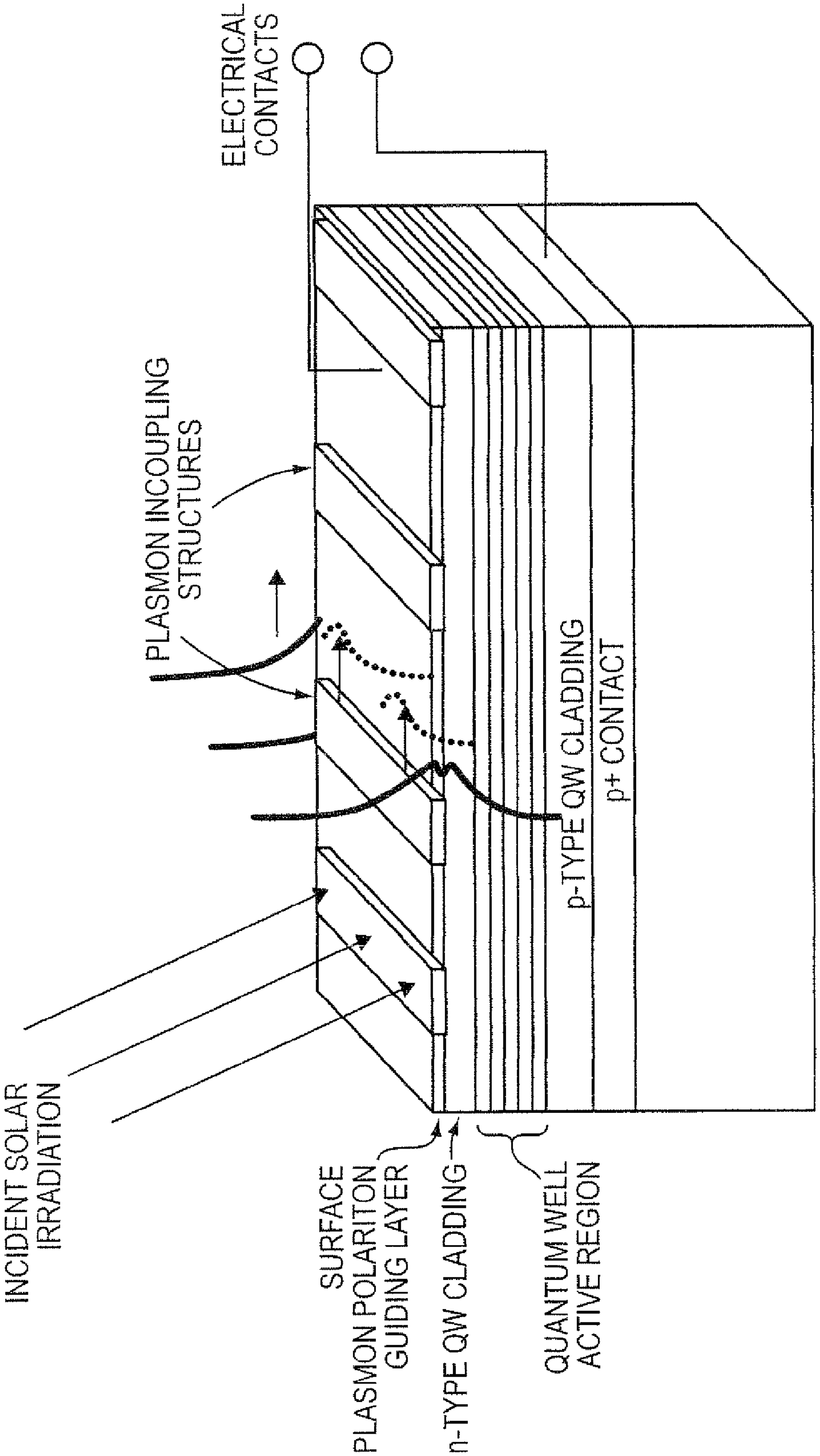
FIG. 2(*a*) is a diagram showing an embodiment of a plasmonic photovoltaic structure comprising a quantum well active region, according to principles of the invention.
Figure 2B:
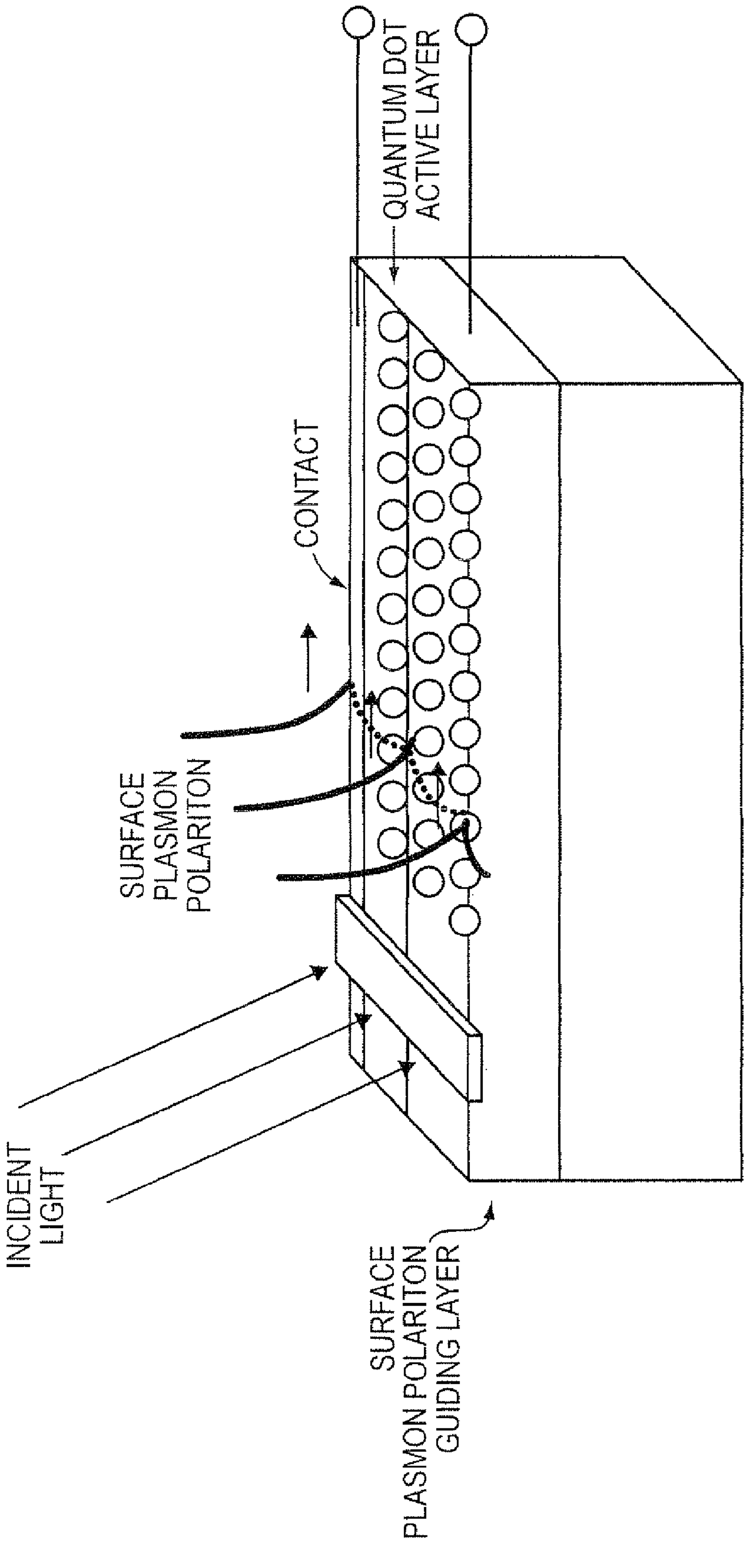
Figure 2C:
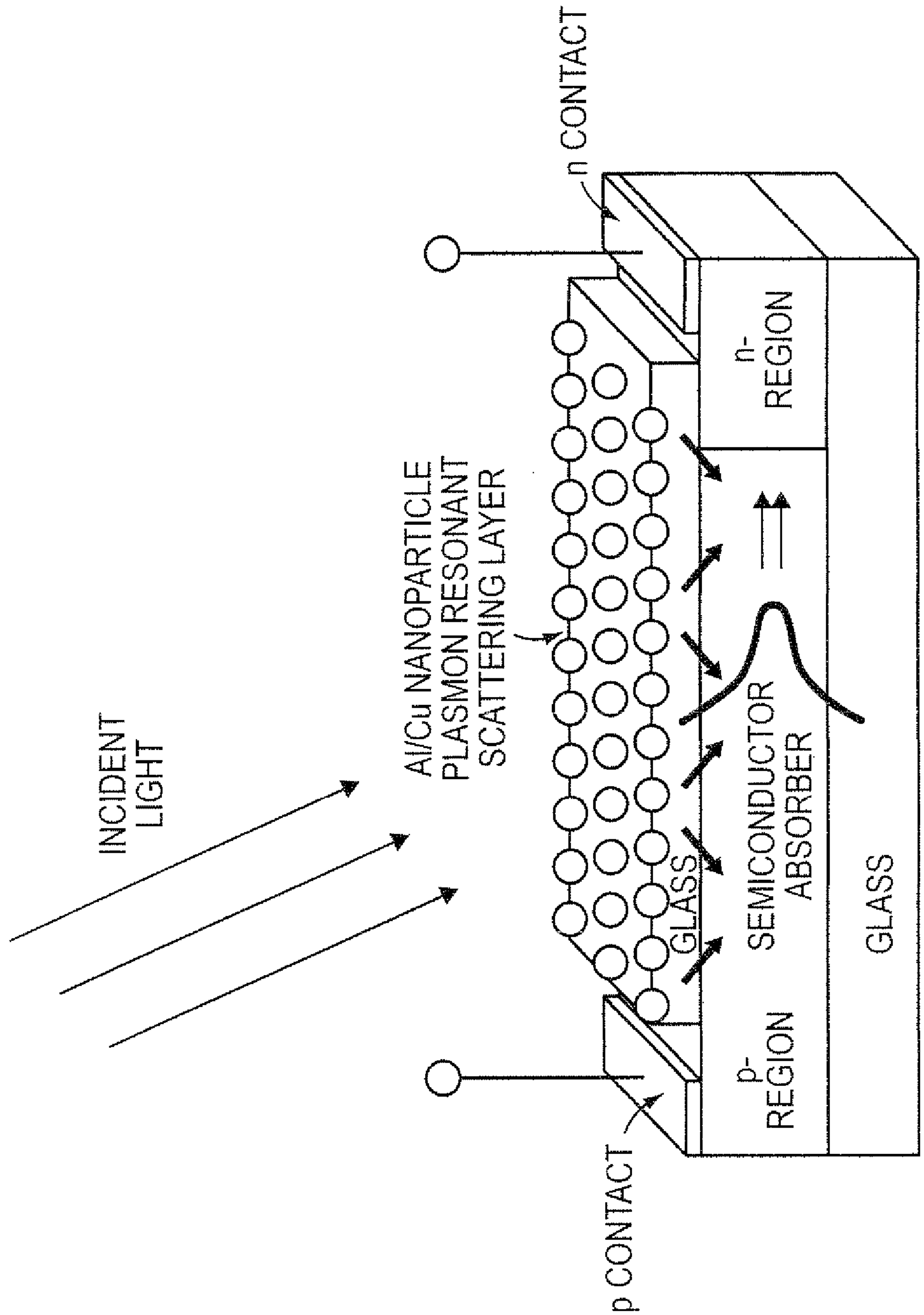

FIG. 2(*a*) is a perspective cross-sectional diagram showing an embodiment of a plasmonic photovoltaic structure comprising a quantum well active region. The structure of FIG. 2(*a*) is similar to that of FIG. 1, with the substitution of a p-type quantum well (QW) cladding layer, an active quantum well region, and an n-type quantum well (QW) cladding layer for the p-type semiconductor absorber layer, the pn junction depletion region, and the n-type semiconductor absorber layer of FIG. 1, respectively. It is well known that quantum well structures are commonly fabricated using various materials in the III-V class of semiconductors, such as GaAs. InP, AlSb and alloys or combinations of such semiconductors, including materials having compositions such as $Al_{(1-x-y)}Ga_x$-$In_yP_{(1-z)}As_z$, where x, y and z are numbers selected between zero and one. Other compound semiconductors, or semiconductor alloys, can be used to fabricate quantum well structures.

FIG. 2(*b*) is a perspective cross-sectional diagram showing an embodiment of a plasmonic photovoltaic structure comprising a quantum dot active layer. In the structure of FIG. 2(*b*) a substrate is provided, upon which a surface plasmon polariton guiding layer is deposited. As in FIG. 1, this layer can comprise a metal. One or more plasmon incoupling structures are provided on the surface plasmon polariton guiding layer. Additionally, an array of quantum dots of an absorber material, such as a semiconductor, are provided on the surface plasmon polariton guiding layer as an active absorber layer. Electrical contact can be made to the metallic surface plasmon polariton guiding layer and to a contact layer that is in electrical communication with the quantum dot active layer.

FIG. 2(*c*) is a perspective cross-sectional diagram showing an embodiment of a plasmonic photovoltaic structure comprising a metallic nanoparticle plasmon resonant scattering layer. In FIG. 2(*c*) a glass substrate is provided, upon which a semiconductor absorber is provided. The semiconductor absorber can be deposited by any convenient means, such as CVD, MBE, or other procedures known to deposit semiconductor materials. In the embodiment of FIG. 2(*c*), the semiconductor absorber material is doped with an n-type dopant in one area to form an n-type region, and the semiconductor absorber material is doped with a p-type dopant in another area to form a p-type region. Electrical contacts are attached to each region, with the use of well known electrical contact technology, for example using contact technology commonly used in the semiconductor industry. An intrinsic region of effectively undoped (or compensated) semiconductor absorber may be provided between successive n-type and p-type regions. In some embodiments, successive regions of alternating polarity, in a sequence such as -n-i-p-i-n-i-p-i- can be provided with each n-type region and each p-type region having c a contact applied thereto. A thin glass layer is provided above the semiconductor absorber layer, within which or on top of which is provided a layer comprising a plurality of metal nanoparticles that form a plasmon resonant scattering layer. In the embodiment illustrated, the metal nanoparticles comprise one or more of aluminum or copper. The metal nanoparticles can be provided by in situ growth of nanoparticles, by deposition of nanoparticles from a vapor, such as in a PVD or MOCVD reactor, by sputtering, by evaporation, or by any other convenient method.

Figure 3:
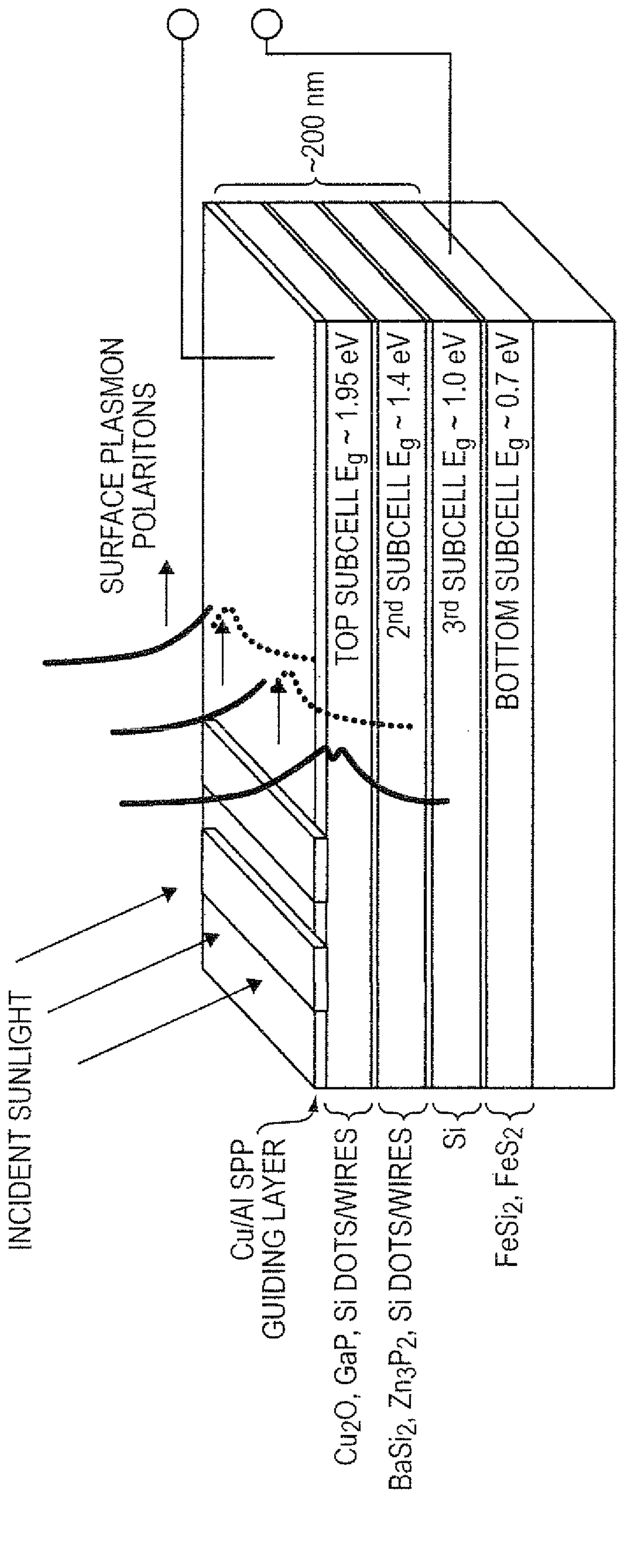
FIG. 3 is a diagram showing an embodiment for a multifunction plasmonic photovoltaic cell, according to principles of the invention.

FIG. 3 is a perspective cross-sectional diagram showing an embodiment for a multijunction plasmonic photovoltaic cell. In FIG. 3 a substrate is provided upon which a plurality of absorber materials are deposited in a selected order.

The energy of a photon is defined by the relation E=hv=hc/λ, where E represents energy, h represents Planck's constant, v represents frequency, c represents the speed of light, and λ represents wavelength. Accordingly, it is understood that photons having longer wavelengths or lower frequency carry less energy that do photons having shorter wavelength and higher frequency. The bandgap energy (or "bandgap") of a semiconductor is the mininimum energy required to excite (or stimulate) a charge carrier from one of the valence band and the conduction band to cross the bandgap to the other band. If one has two semiconductors, one with a larger bandgap and one with a smaller bandgap, light having a high enough frequency to be absorbed by the material with the larger bandgap will be absorbed in both materials (but with a waste of energy in the smaller bandgap material) and light with a frequency just too small to be absorbed by the larger bandgap material will still be absorbed by the material having the smaller bandgap, but will pass unabsorbed through the larger bandgap material (ignoring reflective and scattering effects). Accordingly, it is understood that to extract the maximal energy from a polychromatic radiation beam one should cause the radiation to fall on absorbers in the order of their bandgaps, beginning with the largest bandgap. In addition, selecting bandgaps with a relatively small difference in bandgap energy will ensure that not too many photons are absorbed with a waste of energy (e.g., are absorbed by a material having a considerably smaller bandgap energy than the energy of the photon).

In the multijunction plasmonic photovoltaic cell of FIG. 3, a sequence of materials having bandgaps of the order of (or approximately) 0.7 eV (for example, $FeSi_2$ or $FeS_2$), 1.0 eV (silicon), 1.4 eV (for example, $BaSi_2$, $Zn_3P_4$, or silicon dots or wires), and 1.95 eV (for example, $Cu_2O$, GaP, or silicon dots or wires) are provided successively upon a substrate. In one embodiment, the total thickness of the multiple bandgap junction structure is of the order of 200 nm. As is well known, it may be useful in some embodiments to provide intermediate layers between successive materials having different bandgaps in order to provide electrical contacts or to provide grading layers to minimize changes in crystallographic dimensions between successive layers (e.g., lattice matching layers). From the description already given, it will be understood that such contact or lattice matching layers will need to have bandgaps larger that the layers that they overlay so as not to absorb photons that are intended to be absorbed in lower layers of the structure. A surface plasmon polariton guiding layer is provided on top of the uppermost subcell layer (e.g., the absorber layer having the largest bandgap). As described with regard to FIG. 1 the surface plasmon polariton guiding layer can comprise copper or aluminum, and has adjacent thereto one or more plasmon incoupling structures. The operation of the embodiment of FIG. 3 is similar to that of the embodiment of FIG. 1, with the recognition that the presence of multiple bandgaps can permit the extraction of more energy from the same illumination that would be applied to the structure of FIG. 1.

Ultrathin Planar Surface Plasmon Polariton Photovoltaic Absorbers

It is expected that the conversion of incident light into propagating surface plasmon polaritons can enable efficient light absorption in extremely thin (10's-100's of nanometers thick) photovoltaic absorber layers.

The extraordinary transmission properties of periodic subwavelength apertures and hole arrays in thin metal films have received wide scientific attention. The transmission properties of subwavelength apertures and hole arrays in thin metal films are related to coupling of the incident and transmitted beam to surface plasmons and also to the periodicity of the entrance and exit aperture arrays. A subwavelength aperture functions as a plasmonic absorber structure with a coated semiconductor photovoltaic absorber. Specifically, the aperture array can couple incident light in surface waves (surface plasmon polaritons and evanescent surface waves) that propagate normal to (or at an angle to) the light incidence direction. The propagating surface waves are absorbed in the photovoltaic absorber. If these media are instead semiconductor absorbing layers such that the refractive indices $n_1$ and $n_2$ are complex, very strong absorption can occur since the propagating surface plasmon polariton mode is strongly localized at the metal-semiconductor interface. We have demonstrated experimentally plasmonic absorber structures consisting of subwavelength aperture arrays in Ag thin films, which are subsequently coated with thin (~20 nm or approximately 1-3 layers dot layers) of CdSe quantum dots whose absorption edge is at 600 nm. We find that the in-plane absorbance decay length is 1.2 μm for these 20 nm thick CdSe quantum dot layers on periodic subwavelength aperture arrays at an incident wavelength above the absorption edge of 514.5 nm, indicating very strong surface wave absorption by the thin quantum dot layer.

Comprehensive exploration of the coupling of the incident solar spectrum to surface plasmon polariton modes on periodic metallodielectric arrays coated with semiconductor absorbers (e.g, CdSe, GaAs and/or Si thin films) can yield i) optimal conditions for enhanced integrated spectral plasmonic absorption above the semiconductor absorber bandgap, and ii) conditions that balance the integrated absorption in the thin absorber layer on the aperture array with transmission through to underlying absorbers, as would be required in a multifunction solar cell.

Spectral Tuning of Enhanced Absorption and Emission in Coupled Quantum Dot/Metal Nanoparticle Absorbers Beginning in the 1980's, it was recognized that the enhanced local electric field in the vicinity of a metal structure can enhance the absorption and emission rates of active dipole emitters, such as molecular chromophores, near the metal surface. In the last three years, it has become evident that field enhancement can be employed to dramatically alter the emission rates and intensities of semiconductor quantum dots and quantum wells. Silicon nanocrystals have tunable optical gaps, high internal quantum efficiency and can be fabricated in dense arrays suitable for tunnel injection and collection of photocarriers. However Si nanocrystals, like bulk Si, suffer low optical absorbance due to the indirect energy bandgap, even for Si nanocrystals that exhibit strong quantum excitonic confinement.

Recently, it has been demonstrated that luminescence emission from silicon quantum dot arrays can be enhanced by ~10× by coupling to localized surface plasmon modes in Au nanostructures. It is believed that the enhanced emission is due to an enhanced radiative emission rate of the coupled Au nanostructure/Si nanocrystal system. In samples with less than unity quantum efficiency, enhancement of the radiative emission rate also increases the quantum efficiency. At high pump powers (high carrier injection currents for electrical pumping), the emission intensity is independent of the quantum efficiency, the emission cross section, the photon flux (carrier current), and the non-radiative decay rate. In this regime, the emission intensity therefore scales solely with the radiative decay rate. With precise control of the metal-semiconductor separation distance and careful tuning of the metal particle plasmon resonance frequency, we anticipate a >100-fold enhancement in radiative rate, and therefore absorption and emission intensity, in Si nanocrystals. Both analytic modeling and full field electromagnetic simulation suggest that this potential for the plasmon-enhanced radiative rate enhancement to be >100× the emission or absorption rate that can be achieved relative to Si nanocrystals in purely dielectric matrices. It is believed that achieving this goal experimentally will require careful nanoscale engineering of the coupling between plasmonic metal and Si nanocrystal structures.

The tuning plasmon-enhanced absorption and emission can be realized by careful control of the Si nanocrystal/Ag nanoparticles relative separation, which optimizes the local field enhancement and radiative rate enhancement at the position of the Si nanocrystals. It is expected that this can be done by designing coplanar arrays of aerosol and colloidally-synthesized Si nanocrystals in spin-on glass hosts, and also by sequentially layering of deposited SiO and $SiO_2$ followed by annealing to yield coplanar arrays of Si nanocrystals by SiO decomposition. Full-field electromagnetic simulations can be used to quantity the relationship between radiative rate and local field enhancement for more complex nanoparticles array structures.

For some time, the inventor has been active in plasmonics and semiconductor nanocrystal research, focused on development of materials and electromagnetic designs for plasmonic devices at the subwavelength-to-wavelength scale. The effort includes experimental research on use of near field interactions to enable optical guiding and switching below the diffraction limit and is complemented by theoretical work on near field interactions in and collective modes of subwavelength scale metallodielectric structures. Some of the inventor's contributions to the plasmonics field include the first experimental and theoretical demonstration of light guiding below the diffraction limit in nanoparticle plasmon waveguides, and the theoretical investigation of optical pulse propagation in subwavelength scale plasmon waveguides.

Achieving control of light-material interactions for photonic device applications at nanoscale dimensions will require structures that guide electromagnetic energy with a lateral mode confinement below the diffraction limit of light. This cannot be achieved by using conventional waveguides or photonic crystals. It has been suggested that electromagnetic energy can be guided below the diffraction limit along chains of closely spaced metal nanoparticles that convert the optical mode into non-radiating surface plasmons. A variety of methods such as electron beam lithography and self-assembly have been used to construct metal nanoparticle plasmon waveguides. However, all investigations of the optical properties of these waveguides have so far been confined to collective excitations, and direct experimental evidence for energy transport along plasmon waveguides has proved elusive. Here we present observations of electromagnetic energy transport from a localized subwavelength source to a localized detector over distances of about 0.5 μm in plasmon waveguides consisting of closely spaced silver rods. The waveguides are excited by the tip of a near-field scanning optical microscope, and energy transport is probed by using fluorescent nanospheres. This has been described in the article "Local detection of electromagnetic energy transport below the diffraction limit in metal nanoparticle plasmon waveguides," Nature Materials vol. 2, 229-232 (April, 2003).

We have also provided experimental and theoretical demonstration of resonant plasmon printing of 40 nm lithographic features in conventional photoresist using visible light, and a theoretical demonstration of enhanced subwavelength near field optical resolution by use of a 30 nm Ag film as a lens.

We have previously completed an experimental and theoretical demonstration of strongly-coupled nanoparticle chain arrays in the 'sub-lithographic' size regime, i.e., particle size of ~10 nm and interparticle separations of 1-4 nm. We have demonstrated plasmon-enhanced emission from Si quantum dots. We have provided the first experimental demonstration of plasmon slot waveguides.

It is expected that it will be demonstrated that one can couple dense arrays of semiconductor nanocrystals (particularly Si, CdSe, PbS and PbSe) to metallic nanostructures to form active plasmonic structures. Our previous nanocrystal work has included identification of excitonic and defect luminescence mechanisms for Si and Ge nanocrystals; measurement of exchange energy in Si nanocrystals; tuning emission wavelength and depth profiles of Si nanocrystals fabrication by ion implantation; synthesis and characterization of GaAs nanocrystals by ion implantation and organometallic vapor phase growth, and charge injection into single Si nanocrystals observed by electrostatic force microscopy. In general, the surface plasmon polariton photovoltaic absorbers described herein can utilize a semiconductor that comprises an element from one or more of Groups II, III, IV, V, and VI of the periodic table.

General Comments on Plasmonic Materials

There is currently worldwide interest in developing silicon-based active optical components in order to leverage the infrastructure of silicon microelectronics technology for the fabrication of optoelectronic devices. Light emission in bulk silicon-based devices is constrained in wavelength to infrared emission, and in efficiency by the indirect bandgap of silicon. One promising strategy for overcoming these challenges is to make use of quantum-confined excitonic emission in silicon nanocrystals. A challenge for silicon nanocrystal devices based on nanocrystals embedded in silicon dioxide has been the development of a method for efficient electrical carrier injection. We have demonstrated a scheme for electrically pumping dense silicon nanocrystal arrays by a field-effect electroluminescence mechanism. In this excitation process, electrons and holes are both injected from the same semiconductor channel across a tunneling barrier in a sequential programming process, in contrast to simultaneous carrier injection in conventional pn-junction light-emitting-diode structures. Light emission is strongly correlated with the injection of a second carrier into a nanocrystal that has been previously programmed with a charge of the opposite sign. This work has been described in the article "Field-effect electroluminescence in silicon nanocrystals," Nature Materials, vol 4, 143-146 (February, 2005). We have observed field-effect electroluminescence emission in silicon nanocrystals. We have also quantified the internal quantum efficiency and the absolute radiative emission rate of Si nanocrystal dense arrays by variation of local density of optical states.

The following discussion appeared in an article by the inventor entitled "The Promise of Plasmonics", Scientific American, April 2007. The size and performance of photonic devices are constrained by the diffraction limit; because of interference between closely spaced light waves the width of an optical fiber carrying them must be at least half the light's wavelength inside the material. For chip-based optical signals, which will most likely employ near-infrared wavelengths of about 1,500 nanometers (billionths of a meter), the minimum width is much larger than the smallest electronic devices currently in use; some transistors in silicon integrated circuits, for instance, have features smaller than 100 nanometers.

Recently scientists have been working on a new technique for transmitting optical signals through minuscule nanoscale structures. In the 1980s researchers experimentally confirmed that directing light waves at the interface between a metal and a dielectric (a nonconductive material such as air or glass) can, under the right circumstances, induce a resonant interaction between the waves and the mobile electrons at the surface of the metal. (In a conductive metal, the electrons are not strongly attached to individual atoms or molecules.) In other words, the oscillations of electrons at the surface match those of the electromagnetic field outside the metal. The result is the generation of surface plasmons—density waves of electrons that propagate along the interface like the ripples that spread across the surface of a pond after you throw a stone into the water.

Over the past decade investigators have found that by creatively designing the metal-dielectric interface they can generate surface plasmons with the same frequency as the outside electromagnetic waves but with a much shorter wavelength. This phenomenon could allow the plasmons to travel along nanoscale wires called interconnects, carrying information from one part of a microprocessor to another. Plasmonic interconnects would be a great boon for chip designers, who have been able to develop ever smaller and faster transistors but have had a harder time building minute electronic circuits that can move data quickly across the chip.

In 2000 the inventor's group at the California Institute of Technology gave the name "plasmonics" to this emerging discipline, sensing that research in this area could lead to an entirely new class of devices. Ultimately it may be possible to employ plasmonic components in a wide variety of instruments, using them to improve the resolution of microscopes, the efficiency of light-emitting diodes (LEDs) and the sensitivity of chemical and biological detectors. Scientists are also considering medical applications, designing tiny particles that could use plasmon resonance absorption to kill cancerous tissues, for example. And some researchers have even theorized that certain plasmonic materials could alter the electromagnetic field around an object to such an extent that it would become invisible. Although not all these potential applications may prove feasible, investigators are eagerly studying plasmonics because the new field promises to literally shine a light on the mysteries of the nanoworld.

Research into surface plasmons began in earnest in the 1980s, as chemists studied the phenomenon using Raman spectroscopy, which involves observing the scattering of laser light off a sample to determine its structure from molecular vibrations. In 1989 Thomas Ebbesen, then at the NEC Research Institute in Japan, found that when he illuminated a thin gold film imprinted with millions of microscopic holes, the foil somehow transmitted more light than was expected from the number and size of the holes. Nine years later Ebbesen and his colleagues concluded that surface plasmons on the film were intensifying the transmission of electromagnetic energy.

Two new classes of tools have also accelerated progress in plasmonics: recent increases in computational power have enabled investigators to accurately simulate the complex electromagnetic fields generated by plasmonic effects, and novel methods for constructing nanoscale structures have made it possible to build and test ultrasmall plasmonic devices and circuits.

At first glance, the use of metallic structures to transmit light signals seems impractical, because metals are known for high optical losses. The electrons oscillating in the electromagnetic field collide with the surrounding lattice of atoms, rapidly dissipating the field's energy. But the plasmon losses are lower at the interface between a thin metal film and a dielectric than inside the bulk of a metal because the field spreads into the nonconductive material, where there are no free electrons to oscillate and hence no energy-dissipating collisions. This property naturally confines plasmons to the metallic surface abutting the dielectric; in a sandwich with dielectric and metal layers, for example, the surface plasmons propagate only in the thin plane at the interface.

Because these planar plasmonic structures act as waveguides, shepherding the electromagnetic waves along the metal-dielectric boundary, they could be useful in routing signals on a chip. Although an optical signal suffers more loss in a metal than in a dielectric such as glass, a plasmon can travel in a thin-film metal waveguide for several centimeters before dying out. The propagation length can be maximized if the waveguide employs an asymmetric mode, which pushes a greater portion of the electromagnetic energy away from the guiding metal film and into the surrounding dielectric, thereby lowering loss. Because the electromagnetic fields at the top and bottom surfaces of the metal film interact with each other, the frequencies and wavelengths of the plasmons can be adjusted by changing the thickness of the film. In the 1990s research groups led by Sergey Bozhevolnyi of Aalborg University in Denmark and Pierre Berini of the University of Ottawa developed planar plasmonic components that could perform many of the same functions—such as splitting guided waves—usually done by all-dielectric devices. These structures could prove useful in transmitting data from one part of a chip to another, but the electromagnetic fields accompanying the plasmons are too large to convey signals through the nanoscale innards of a processor.

To generate plasmons that can propagate through nanoscale wires, researchers have explored more complex waveguide geometries that can shrink the wavelength of the signal by squeezing it into a narrow space. In the late 1990s the inventor's lab group and a team led by Joachim Krenn of the University of Graz in Austria launched parallel efforts to produce these "subwavelength" surface-plasmon waveguides. Working with the inventor at Caltech, Stefan Maier built a structure consisting of linear chains of gold dots, each less than 100 nanometers across. A visible beam with a wavelength of 570 nanometers triggered resonant oscillations in the dots, generating surface plasmons that moved along the chains, confined to a flattened path only 75 nanometers high. The Graz group achieved similar results and imaged the patterns of the plasmons carried along the chains. The absorption losses of these nanowires were relatively high, however, causing the signal to die out after it traveled a few hundred nanometers to a few microns (millionths of a meter). Thus, these waveguides would be suitable only for very short-range interconnections.

Fortunately, the absorption losses can be minimized by turning the plasmonic waveguides inside out, putting the dielectric at the core and surrounding it with metal. In this device, called a plasmon slot waveguide, adjusting the thickness of the dielectric core changes the wavelength of the plasmons. The inventor's lab at Caltech and Mark Brongersma's Stanford University group have shown that plasmon slot waveguides are capable of transmitting a signal as far as tens of microns. Hideki Miyazaki of the National Institute for Materials Science in Japan obtained a striking result by squeezing red light (with a wavelength of 651 nanometers in free space) into a plasmon slot waveguide that was only three nanometers thick and 55 nanometers wide. The researchers found that the wavelength of the surface plasmon propagating through the device was 51 nanometers, or about 8 percent of the free-space wavelength.

Plasmonics can thus generate signals in the soft x-ray range of wavelengths (between 10 and 100 nanometers) by exciting materials with visible light. The wavelength can be reduced by more than a factor of 10 relative to its free-space value, and yet the frequency of the signal remains the same. (The fundamental relation between the two—frequency times wavelength equals the speed of light—is preserved because the electromagnetic waves slow as they travel along the metal-dielectric interface.) This striking ability to shrink the wavelength opens the path to nanoscale plasmonic structures that could replace purely electronic circuits containing wires and transistors.

Just as lithography is now used to imprint circuit patterns on silicon chips, a similar process could mass-produce minuscule plasmonic devices with arrays of narrow dielectric stripes and gaps. These arrays would guide the waves of positive and negative charge on the metal surface; the alternating charge densities would be very much akin to the alternating current traveling along an ordinary wire. But because the frequency of an optical signal is so much higher than that of an electrical one—more than 400,000 gigahertz versus 60 hertz—the plasmonic circuit would be able to carry much more data. Moreover, because electrical charge does not travel from one end of a plasmonic circuit to another—the electrons bunch together and spread apart rather than streaming in a single direction—the device is not subject to resistance and capacitance effects that limit the data-carrying capacity of integrated circuits with electrical interconnects.

Plasmonic circuits would be even faster and more useful if researchers could devise a "plasmonster" switch—a three-terminal plasmonic device with transistor like properties. The inventor's lab at Caltech and other research groups have recently developed low-power versions of such a switch. If scientists can produce plasmonsters with better performance, the devices could serve as the core of an ultrafast signal-processing system, an advance that could revolutionize computing 10 to 20 years from now.

Plasmonic materials may also revolutionize the fighting industry by making LEDs bright enough to compete with incandescent bulbs. Beginning in the 1980s, researchers recognized that the plasmonic enhancement of the electric field at the metal-dielectric boundary could increase the emission rate of luminescent dyes placed near the metal's surface. More recently, it has become evident that this type of field enhancement can also dramatically raise the emission rates of quantum dots and quantum wells—tiny semiconductor structures that absorb and emit light—thus increasing the efficiency and brightness of solid-state LEDs. In 2004 Axel Scherer of Caltech, together with co-workers at Japan's Nichia Corporation, demonstrated that coating the surface of a gallium nitride LED with dense arrays of plasmonic nanoparticles (made of silver, gold or aluminum) could increase the intensity of the emitted light 14-fold.

Furthermore, plasmonic nanoparticles may enable researchers to develop LEDs made of silicon. Such devices, which would be much cheaper than conventional LEDs composed of gallium nitride or gallium arsenide, are currently held back by their low rates of light emission. The inventor's group at Caltech, working with a team led by Albert Polman of the FOM Institute for Atomic and Molecular Physics in the Netherlands, has shown that coupling silver or gold plasmonic nanostructures to silicon quantum-dot arrays could boost their light emission by about 10 times. Moreover, it is possible to tune the frequency of the enhanced emissions by adjusting the dimensions of the nanoparticles. Our calculations indicate that careful tuning of the plasmonic resonance frequency and precise control of the separation between the metallic particles and the semiconductor materials may enable us to increase radiative rates more than 100-fold, allowing silicon LEDs to shine just as brightly as traditional devices.

Theoretical Discussion

Although the theoretical description given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

While the present invention has been particularly shown and described with reference to the structure and methods disclosed herein and as illustrated in the drawings, it is not confined to the details set forth and this invention is intended to cover any modifications and changes as may come within the scope and spirit of the following claims.

What is claimed is:

1. A surface plasmon polariton photovoltaic absorber, comprising:

a substrate;

a first absorber layer on the substrate;

a second absorber layer on the first absorber layer, the second absorber layer having a larger bandgap than the first absorber layer and comprising quantum dots or wires comprising $BaSi_2$, $Zn_3P_2$ or Si;

a third absorber layer on the second absorber layer, the third absorber layer having a larger bandgap than the second absorber layer;

a layer of conductive material comprising a surface plasmon polariton guiding layer comprising metallic nanoparticles comprising at least one metal selected from the group consisting of silver, gold, copper, and aluminum on the third absorber layer; and at least two electrodes, a first electrode in electrical communication with a first charge collection region of the photovoltaic absorber in which electrical charges of a first polarity are concentrated, and a second electrode in electrical communication with a second charge collection region of the photovoltaic absorber in which electrical charges of a second polarity are concentrated, wherein the surface plasmon polariton photovoltaic absorber is configured to generate an electrical potential between the first and second electrodes when the surface plasmon polariton photovoltaic absorber is illuminated with electromagnetic radiation.

2. The surface plasmon polariton photovoltaic absorber of claim 1, where the first absorber layer comprises a polycrystalline semiconductor thin film.

3. The surface plasmon polariton photovoltaic absorber of claim 1, wherein the first absorber layer comprises an epitaxial semiconductor thin film.

4. The surface plasmon polariton photovoltaic absorber of claim 1, wherein the third absorber layer comprises an element from Group III or Group V of the periodic table.

5. The surface plasmon polariton photovoltaic absorber of claim 1, wherein the metallic nanoparticles comprise copper, aluminum, or combinations thereof.

6. The surface plasmon polariton photovoltaic absorber of claim 5, wherein the metallic nanoparticles comprise aluminum.

7. The surface plasmon polariton photovoltaic absorber of claim 1, wherein one of the first and second absorber layers comprises a dense array of quantum dots.

8. The surface plasmon polariton photovoltaic absorber of claim 1, wherein one of the first and second absorber layers comprises a dense array of quantum wires.

9. The surface plasmon polariton photovoltaic absorber of claim 1, further comprising a second substrate comprising a glass substrate on the third absorber layer, wherein the metallic nanoparticles are on the glass substrate.

10. The surface plasmon polariton photovoltaic absorber of claim 1, wherein the metallic nanoparticles are disposed between the first and second electrodes.

11. The surface plasmon polariton photovoltaic absorber of claim 10, wherein the metallic nanoparticles comprise copper, aluminum, or combinations thereof.

12. The surface plasmon polariton photovoltaic absorber of claim 11, wherein the metallic nanoparticles comprise copper.

* * * * *